(12) United States Patent
Chang et al.

(10) Patent No.: US 7,824,945 B2
(45) Date of Patent: Nov. 2, 2010

(54) METHOD FOR MAKING MICRO-ELECTROMECHANICAL SYSTEM DEVICES

(75) Inventors: Tso-Chi Chang, Hsinchu Hsien (TW); Mingching Wu, Hsinchu Hsien (TW)

(73) Assignee: Asia Pacific Microsystems, Inc., Hsinchu Hsien (TW)

( * ) Notice: Subject to any disclaimer, the term of this patent is extended or adjusted under 35 U.S.C. 154(b) by 162 days.

(21) Appl. No.: 12/244,258

(22) Filed: Oct. 2, 2008

(65) Prior Publication Data
US 2009/0311819 A1  Dec. 17, 2009

(30) Foreign Application Priority Data
Oct. 18, 2007  (TW)  .............................. 96139003 A

(51) Int. Cl.
*H01L 21/00* (2006.01)
(52) U.S. Cl. .................. 438/51; 438/106; 438/107; 438/108; 438/109; 438/120; 438/110; 438/111; 438/112; 438/113; 438/114; 438/115; 438/116; 438/117; 438/118; 438/119; 438/121; 438/122; 438/123; 438/124; 438/125; 438/126; 438/127; 257/790; 257/E21.502; 257/E21.499; 257/19
(58) Field of Classification Search ......... 438/106–127; 264/272.11, 272.17; 381/423, 396; 257/790, 257/E21.502, E21.499, 19
See application file for complete search history.

(56) References Cited

U.S. PATENT DOCUMENTS

| | | | | |
|---|---|---|---|---|
| 5,470,783 A * | 11/1995 | Chiu et al. | .................. | 438/446 |
| 5,596,222 A * | 1/1997 | Bernstein | .................. | 257/620 |
| 5,684,324 A * | 11/1997 | Bernstein | .................. | 257/415 |
| 6,426,239 B1 * | 7/2002 | Gogoi et al. | .................. | 438/53 |
| 6,746,891 B2 * | 6/2004 | Cunningham et al. | ......... | 438/52 |
| 6,827,866 B1 * | 12/2004 | Novotny | .................. | 216/2 |
| 6,847,090 B2 * | 1/2005 | Loeppert | .................. | 257/418 |
| 6,936,524 B2 * | 8/2005 | Zhu et al. | .................. | 438/459 |
| 6,996,306 B2 * | 2/2006 | Chen et al. | .................. | 385/18 |
| 7,049,051 B2 * | 5/2006 | Gabriel et al. | .................. | 430/322 |
| 7,091,057 B2 * | 8/2006 | Gan et al. | .................. | 438/48 |
| 7,146,016 B2 * | 12/2006 | Pedersen | .................. | 381/175 |
| 7,159,459 B2 * | 1/2007 | Gogoi | .................. | 73/504.02 |
| 7,190,854 B1 * | 3/2007 | Novotny et al. | .................. | 385/18 |
| 7,280,436 B2 * | 10/2007 | Pedersen | .................. | 367/178 |
| 7,351,609 B2 * | 4/2008 | Wu et al. | .................. | 438/106 |
| 7,449,356 B2 * | 11/2008 | Weigold | .................. | 438/53 |
| 7,482,196 B2 * | 1/2009 | Urano et al. | .................. | 438/69 |
| 7,585,744 B2 * | 9/2009 | Gogoi et al. | .................. | 438/422 |
| 2002/0132389 A1 * | 9/2002 | Patel et al. | .................. | 438/97 |

(Continued)

*Primary Examiner*—Fernando L Toledo
*Assistant Examiner*—Ankush K Singal
(74) *Attorney, Agent, or Firm*—Whyte Hirschboeck Dudek SC

(57) ABSTRACT

A method for making micro-electromechanical system devices includes: (a) forming a sacrificial layer on a device wafer; (b) forming a plurality of loop-shaped through-holes in the sacrificial layer so as to form the sacrificial layer into a plurality of enclosed portions; (c) forming a plurality of cover caps on the sacrificial layer such that the cover caps respectively enclose the enclosed portions of the sacrificial layer; (d) forming a device through-hole in each of active units of the device wafer so as to form an active part suspended in each of the active units; and (e) removing the enclosed portions of the sacrificial layer through the device through-holes in the active units of the device wafer.

17 Claims, 11 Drawing Sheets

U.S. PATENT DOCUMENTS

| | | | |
|---|---|---|---|
| 2003/0036215 A1* | 2/2003 | Reid | 438/52 |
| 2003/0048036 A1* | 3/2003 | Lemkin | 310/309 |
| 2003/0133588 A1* | 7/2003 | Pedersen | 381/423 |
| 2004/0029360 A1* | 2/2004 | Geefay et al. | 438/459 |
| 2004/0063325 A1* | 4/2004 | Urano et al. | 438/692 |
| 2004/0248344 A1* | 12/2004 | Partridge et al. | 438/127 |
| 2004/0259286 A1* | 12/2004 | Dehe et al. | 438/50 |
| 2005/0186793 A1* | 8/2005 | Omoto et al. | 438/687 |
| 2005/0189621 A1* | 9/2005 | Cheung | 257/619 |
| 2005/0249041 A1* | 11/2005 | Pedersen | 367/179 |
| 2005/0250253 A1* | 11/2005 | Cheung | 438/125 |
| 2006/0093170 A1* | 5/2006 | Zhe et al. | 381/191 |
| 2006/0093171 A1* | 5/2006 | Zhe et al. | 381/191 |
| 2006/0145570 A1* | 7/2006 | Ohbayashi et al. | 310/322 |
| 2006/0267210 A1* | 11/2006 | Yamano et al. | 257/774 |
| 2006/0291674 A1* | 12/2006 | Gong et al. | 381/174 |
| 2007/0029894 A1* | 2/2007 | Yamaoka et al. | 310/311 |
| 2007/0092983 A1* | 4/2007 | Weigold | 438/52 |
| 2007/0154040 A1* | 7/2007 | Chen | 381/174 |
| 2007/0241415 A1* | 10/2007 | Ko et al. | 257/415 |

* cited by examiner

US 7,824,945 B2

METHOD FOR MAKING MICRO-ELECTROMECHANICAL SYSTEM DEVICES

CROSS-REFERENCE TO RELATED APPLICATION

This application claims priority of Taiwanese application No. 096139003, filed on Oct. 18, 2007.

BACKGROUND OF THE INVENTION

1. Field of the Invention

The invention relates to a method for making micro-electromechanical system (MEMS) devices, more particularly to a method involving forming cover caps on a device wafer through film encapsulating techniques for making MEMS devices.

2. Description of the Related Art

Micro-electromechanical system (MEMS) devices, such as electrostatic accelerometers, sensors, actuators, and condenser microphones, normally include a movable active part or mass suspended in an enclosed cavity. The active part is connected to and is suspended on a surrounding wall through cantilever(s) so as to be suspended and movable relative to the surrounding wall and so as to properly perform a desired function. However, the cantilever(s) is relatively fragile, and tends to be damaged during wafer dicing or die packaging for forming individual chips of the MEMS devices if left unprotected. Two main approaches, i.e., the wafer bonding techniques and the film encapsulating techniques, have been developed to protect the cantilevers and the active parts from being damaged during dicing or die packaging for the production of the MEMS devices. In the wafer bonding techniques, a cover wafer formed with holes is bonded to a device wafer formed with the MEMS dies through wafer bonding techniques. The assembly of the device wafer and the cover wafer is subsequently subjected to dicing so as to form individual MEMS devices which are then packaged to form chip-level MEMS packages. However, the manufacturing costs of the MEMS devices using wafer bonding techniques are relatively high.

Referring to FIGS. 1A to 1D, U.S. Pat. No. 6,936,491 discloses a method using the film encapsulating techniques to form the cover caps 90 (see FIG. 1D) on a device wafer having a device-preformed structure including active parts 92, surrounding walls 95, and cantilevers (not shown). Each of the active parts 92 is surrounded by and is connected to a respective one of the surrounding walls 95 through a corresponding one or corresponding ones of the cantilevers so as to be suspended on and be movable relative to the surrounding wall 95 in a cavity surrounded by the surrounding wall 95. However, the method requires formation of a sacrificial layer 91 of a silicon dioxide (see FIG. 1A) on the device wafer such that the sacrificial layer 91 fills the cavities in the device wafer so as to permit formation of a first encapsulation layer 93 (see FIG. 1B) indirectly on a front side of the device wafer through the sacrificial layer 91 (otherwise the first encapsulation layer 93 would fill the cavities to enclose the active parts 92 when the sacrificial layer 91 is not formed), and further requires formation of holes 930 in the first encapsulation layer 93 (see FIG. 1C) for removal of the sacrificial layer 91 through the holes 930, and closing of the holes 930 thereafter by forming a second encapsulation layer 94 on the first encapsulation layer 93 (see FIG. 1D). As such, the method is relatively complicated, and the cantilever(s) may be damaged due to the stress imparted thereto by the sacrificial layer 91 that encloses the cantilever(s) and the active parts 92. In addition, since the first and second encapsulation layers 93, 94 are formed through deposition techniques, they are relatively thin and thus are likely to collapse during dicing or packaging, thereby resulting in damage to the cantilevers and the active parts 92.

SUMMARY OF THE INVENTION

Therefore, an object of the present invention is to provide a method for making micro-electromechanical system devices that can overcome the aforesaid drawbacks associated with the prior art.

According to the present invention, there is provided a method for making micro-electromechanical system devices. The method comprises: (a) forming a sacrificial layer on a front side of a device wafer which has a plurality of active units; (b) forming a plurality of loop-shaped through-holes in the sacrificial layer so as to form the sacrificial layer into a plurality of enclosed portions, each of which is surrounded by a loop-shaped route of a respective one of the loop-shaped through-holes and each of which is aligned with a respective one of the active units of the device wafer; (c) forming a plurality of cover caps on the sacrificial layer such that each of the cover caps is aligned with a respective one of the active units of the device wafer and extends into a respective one of the loop-shaped through-holes in the sacrificial layer to contact the front side of the device wafer so as to cooperate with a respective one of the active units of the device wafer to enclose a respective one of the enclosed portions of the sacrificial layer; (d) forming a device through-hole in each of the active units of the device wafer so as to form an active part suspended in each of the active units of the device wafer and so as to expose a respective one of the enclosed portions of the sacrificial layer from a back side of the device wafer; and (e) removing the enclosed portions of the sacrificial layer through the device through-holes in the active units of the device wafer.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1A:
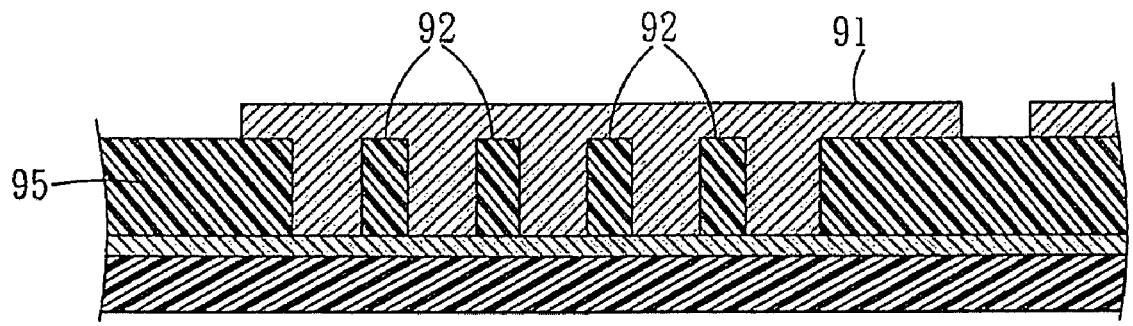
FIGS. 1A to 1D are schematic sectional views to illustrate consecutive steps of a conventional method for making MEMS devices.
Figure 1B:
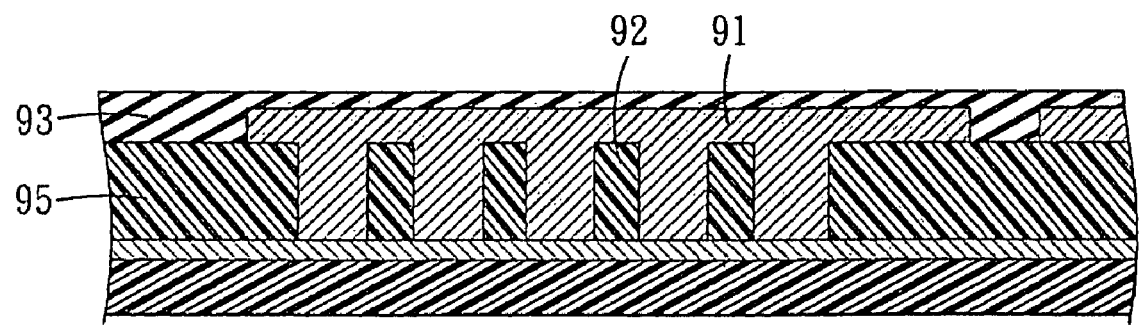
Figure 1C:
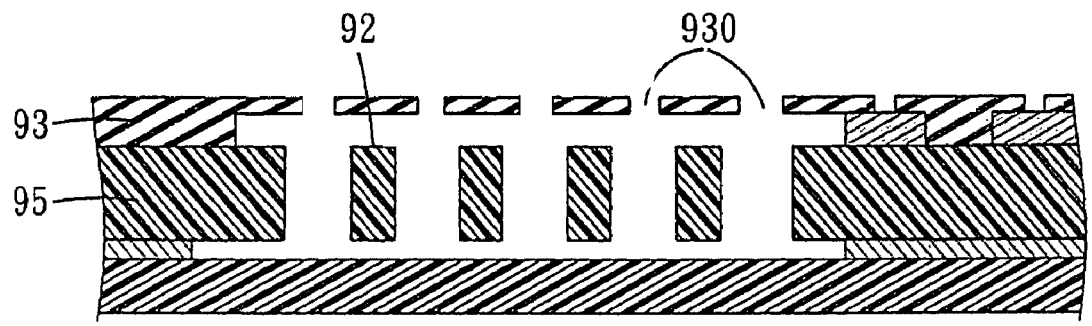
Figure 1D:
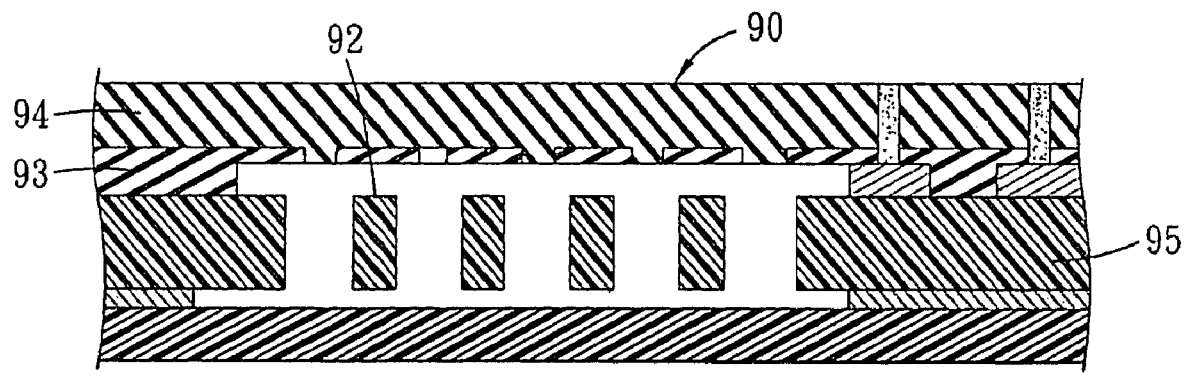

Before the present invention is described in greater detail with reference to the accompanying preferred embodiment, it should be noted herein that like elements are denoted by the same reference numerals throughout the disclosure.

Figure 2A:
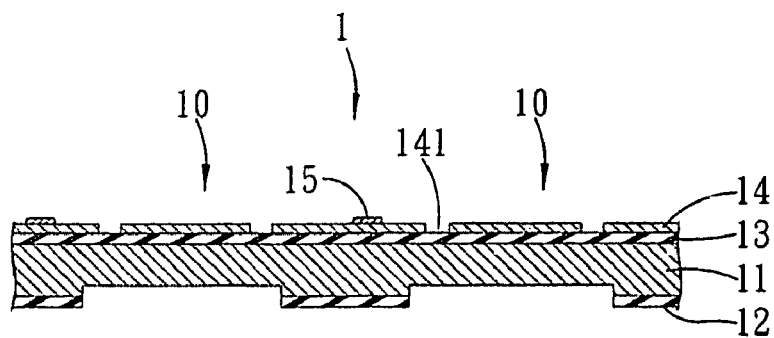
FIGS. 2A to 2K are schematic sectional views to illustrate consecutive steps of the first preferred embodiment of a method for making MEMS devices according to this invention.
Figure 2B:
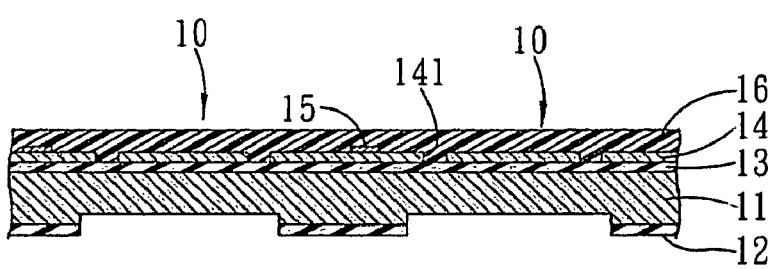
Figure 2C:
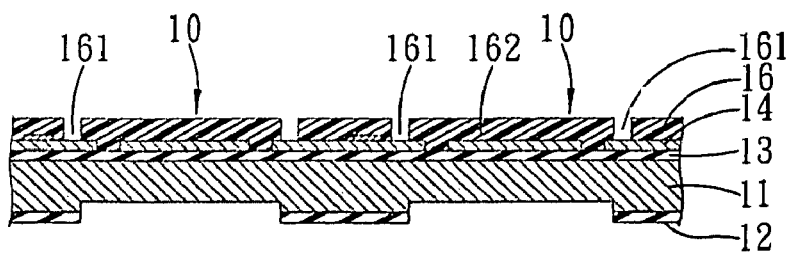
Figure 2D:
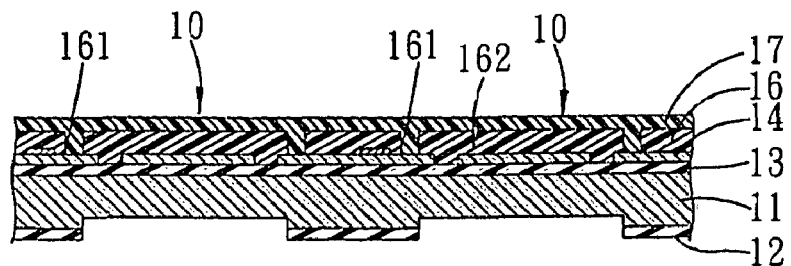
Figure 2E:
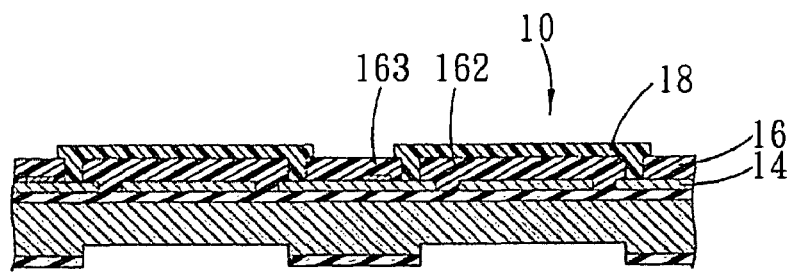
Figure 2F:
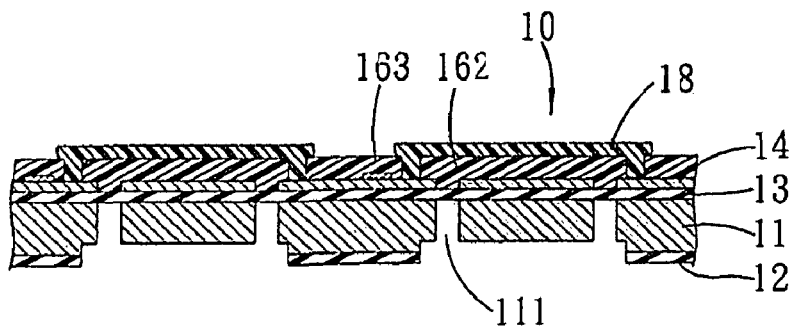
Figure 2G:
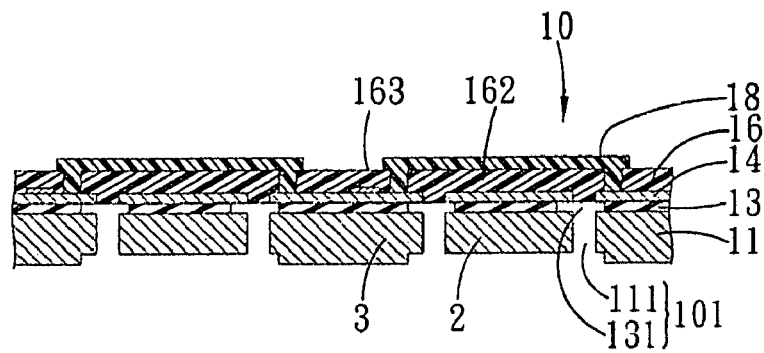
Figure 2H:
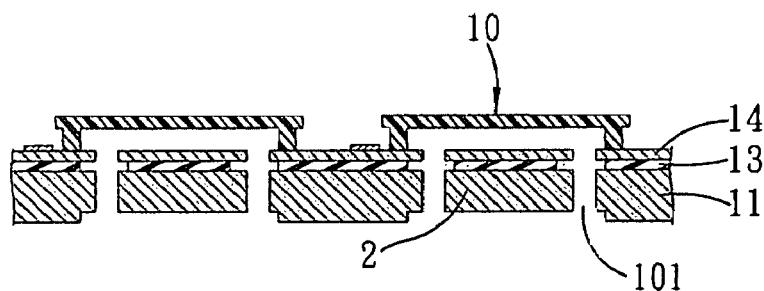
Figure 2I:
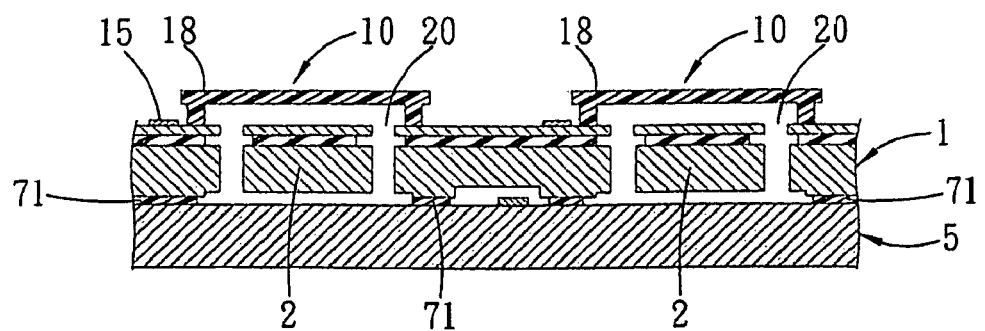
Figure 2J:
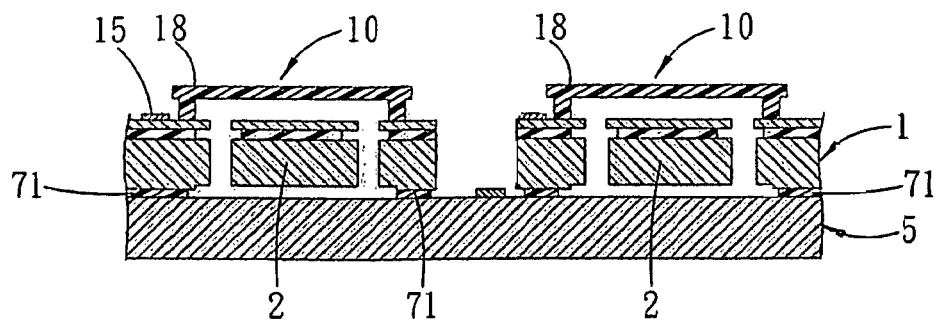
Figure 2K:
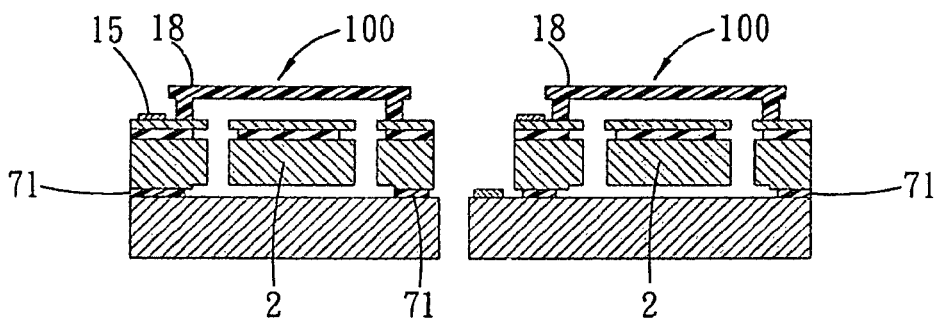
Figure 2L:
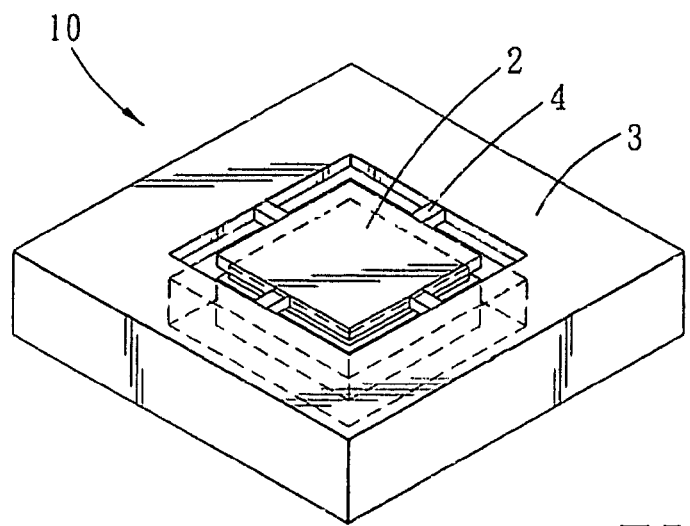
FIG. 2L is a perspective view to illustrate the structure of an active part of a MEMS die formed by an etching step in the method of the first preferred embodiment after formation of cover caps.

FIGS. 2A to 2K illustrate consecutive steps of the first preferred embodiment of a method for making micro-electromechanical system (MEMS) devices 100, such as electrostatic accelerometers, according to the present invention. The method includes the steps of: (a) preparing a device wafer 1 having a plurality of active units 10 (see FIG. 2A) and forming a sacrificial layer 16 on a front side of the device wafer 1 (see FIG. 2B); (b) forming a plurality of loop-shaped through-holes 161 in the sacrificial layer 16 so as to form the sacrificial layer 16 into a plurality of enclosed portions 162 (see FIG. 2B), each of which is surrounded by a loop-shaped route of a respective one of the loop-shaped through-holes 161 and each of which is aligned with a respective one of the active units 10 of the device wafer in a normal direction relative to the device wafer 1 (see FIG. 2C); (c) forming a plurality of cover caps 18 on the sacrificial layer 16 (see FIG. 2E) such that each of the cover caps 18 is aligned with a respective one of the active units 10 of the device wafer 1 in the normal direction and extends into a respective one of the loop-shaped through-holes 161 in the sacrificial layer 16 to contact the front side of the device wafer 1 so as to cooperate with a respective one of the active units 10 of the device wafer 1 to enclose a respective one of the enclosed portions 162 of the sacrificial layer 16; (d) forming a device through-hole 101 in each of the active units 10 of the device wafer 1 (see FIG. 2G) so as to form a surrounding wall 3, an active part 2, and cantilevers 4 in each of the active units 10 and so as to expose a respective one of the enclosed portions 162 of the sacrificial layer 16 from a back side of the device wafer 1, the active part 2 being surrounded by the surrounding wall 3 and being suspended on the surrounding wall 3 through the cantilevers 4 (see FIG. 2L) so as to be movable relative to the surrounding wall 3 of each of the active units 10 of the device wafer 1 for performing a desired function; (e) removing the enclosed portions 162 of the sacrificial layer 16 through the device through-holes 101 in the active units 10 of the device wafer 1 (see FIG. 2H); (f) attaching a circuit wafer 5 to the back side of the device wafer 1 through adhesive pads 71 of a bonding material after step (e) such that the circuit wafer 5 cooperates with the cover caps 18 and the surrounding walls 3 of the active units 10 of the device wafer 1 to define enclosed cavities 20 thereamong for enclosing the active parts 2 in the enclosed cavities 20, respectively (see FIG. 2I); (g) cutting the device wafer 1 of an assembly of the device wafer 1, the circuit wafer 5 and the cover caps 18 along cutting lines (not shown) on the device wafer 1 (see FIG. 2J) using a first cutter (not shown) having a thick edge so as to separate the device wafer 1 into individual dies, each corresponding to a respective one of the active units 10; and (h) further cutting the circuit wafer 5 of the assembly of the device wafer 1, the circuit wafer 5 and the cover caps 18 along cutting lines (not shown) on the circuit wafer 5 (see FIG. 2K) using a second cutter (not shown) having a thin edge so as to separate the circuit wafer 5 into individual dies, each cooperating with a respective one of the dies of the device wafer 1 and a respective one of the cover caps 18 to form a respective one of the MEMS devices 100. The bonding material is preferably a photosensitive material, such as bisbenzocyclobutene (BCB), so as to permit patterning of the bonding material to form the adhesive pads 71 through photolithographic techniques. The bonding of the circuit wafer 5 to the device wafer 1 through the adhesive pads 71 is conducted by heating the bonding material to a temperature of about 250° C.

In this embodiment, the device wafer 1 is a silicon-on-insulator (SOI) wafer, and includes an active layer 11, a suspender layer 14, and an insulator layer 13 sandwiched between the active layer 11 and the suspender layer 14. The active layer 11 is made from silicon, the insulator layer 13 is made from silicon dioxide, and the suspender layer 14 is made from silicon. The suspender layer 14 and the active layer 11 define the front and back sides of the device wafer 1, respectively. The sacrificial layer 16 is formed on the suspender layer 14 in step (a). Preferably, the suspender layer 14 is patterned prior to the formation of the sacrificial layer 16 thereon so as to form a plurality of through-holes 141 therein at each of the active units 10 for defining the cantilevers 4 of the respective one of the active units 10. A protective mask 12 of silicon dioxide is formed on the back side of the device wafer 1 for protecting the device wafer 1 during subsequent processing. The sacrificial layer 16 extends into the through-holes 141 in the suspender layer 14 in step (a). As such, the device through-hole 101 formed in each of the active units 10 in step (d) is required to extend only through the active layer 11 and the insulator layer 13 so as to be in spatial communication with the through-holes 141 in the suspender layer 14 at the respective one of the active units 10. When the suspender layer 14 is not patterned to form the through-holes 141 prior to the formation of the sacrificial layer 16 thereon, the device through-hole 101 formed in each of the active units 10 in step (d) is required to extend through the active layer 11, the insulator layer 13 and the suspender layer 14 so as to release the respective one of the active parts 2 and to expose the respective one of the enclosed portions 162 of the sacrificial layer 16. Since the active parts 2 are released from the respective surrounding walls 3 (see FIG. 2G) of the active units 10 after the cover caps 18 are formed, the stress imparted by the sacrificial layer to the active parts and the cantilevers as encountered in the aforesaid conventional method can be eliminated.

In this embodiment, the sacrificial layer 16 is made from a photoresist material, and is formed by applying the photoresist material on the suspender layer 14 through spin coating. The sacrificial layer 16 thus formed has a layer thickness of about 5 µm, and is patterned using an anchor-forming mask (not shown) through photolithographic techniques so as to form the through-holes 161. In this embodiment, the through-holes 161 in the sacrificial layer 16 have an inner diameter of about 1 mm and an outer diameter of about 1.2 mm. The enclosed portions 162 of the sacrificial layer 16 in step (e) are removed using a photoresist cleaner in a conventional manner. Note that in this embodiment, a non-enclosed portion 163 of the sacrificial layer 16 (see FIGS. 2E and 2G) that surrounds each of the cover caps 18 is also removed together with the enclosed portions 162 in step (e).

In this embodiment, formation of the cover caps 18 on the patterned sacrificial layer 16 in step (c) is conducted by forming a cap-forming layer 17 of a photosensitive material on the sacrificial layer 16 (see FIG. 2D) such that the cap-forming layer 17 extends into the through-holes 161 for forming an anchor portion of each cover cap 18, followed by patterning the cap-forming layer 17 using a cap-forming mask (not shown) through photolithographic techniques for forming a top portion of each cover cap 18 that is lifted by the anchor portion so as to be spaced apart from the front side of the device wafer 1. Preferably, the cap-forming layer 17 is made from bisbenzocyclobutene (BCB), and is applied to the patterned sacrificial layer 16 using spin coating.

In this embodiment, formation of the device through-hole 101 in each of the active units 10 of the device wafer 1 is conducted by forming a first hole 111 in the active layer 11 (see FIG. 2F), followed by forming a second hole 131 in the insulator layer 13 (see FIG. 2G) that is in spatial communication with the first hole 111 in the active layer 11 and the through-holes 141 in the suspender layer 14 at the respective one of the active units 10. Formation of the first hole 111 in the active layer 11 at each of the active units 10 is conducted through inductively coupled plasma (ICP) etching techniques. Formation of the second hole 131 in the insulator layer 13 at each of the active units 10 is conducted through wet etching techniques using HF solution as etchant. The protective mask 12 is simultaneously removed during formation of the second hole 131 in the insulator layer 13 through the wet etching operation.

Figure 3A:
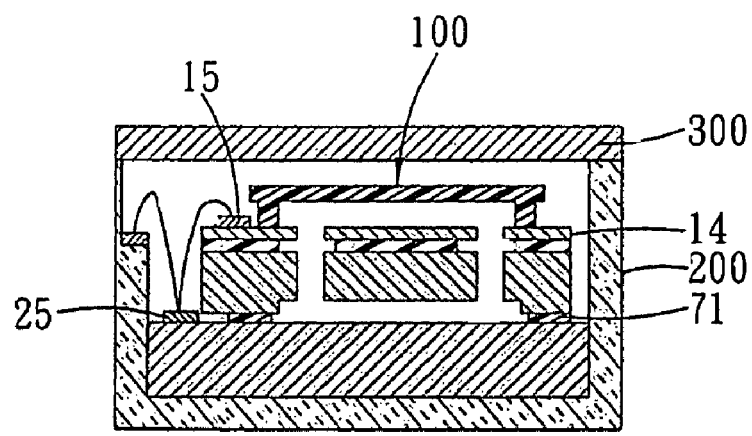
FIG. 3A is a schematic sectional view to illustrate a configuration of a MEMS package formed by ceramic packaging a MEMS device made by the method of the first preferred embodiment using a container and a cover plate.

FIG. 3A illustrates a configuration of a MEMS package formed by encapsulating the MEMS device 100, which is made by the method of the first preferred embodiment, using a ceramic container 200 and a cover plate 300 through ceramic packaging techniques. During packaging, the MEMS device 100 is disposed in the ceramic container 200, and is subsequently sealed hermetically in the ceramic container 200 by the cover plate 300. The device wafer 1 is provided with a plurality of conductive pads 15 (only one is shown) on the suspender layer 14 at each of the active units 10 for coupling the MEMS device 100 to an external device (not shown). Each of the dies of the circuit wafer 5 is provided with a plurality of conductive pads 25 that are respectively connected to the conductive pads 15 of a respective one of the dies of the device wafer 1 through wire bonding techniques. Note that in this embodiment, the conductive pads 25 and the adhesive pads 71 are disposed at the same side of the die of the circuit wafer 5.

Figure 3B:
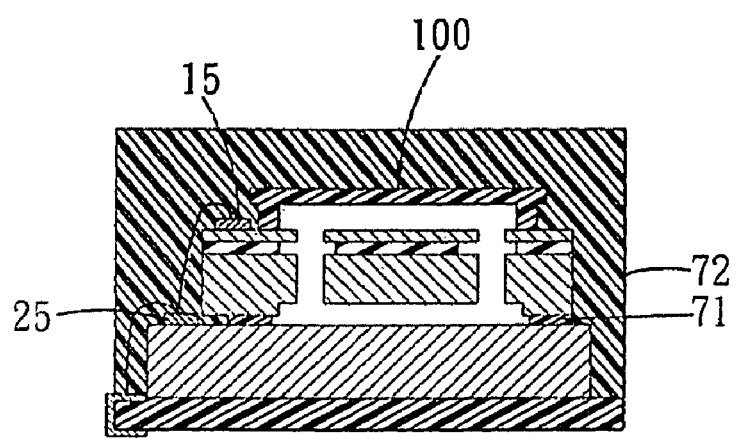
FIG. 3B is a schematic sectional view to illustrate a configuration of a MEMS package formed by post-molded packaging a MEMS device made by the method of the first preferred embodiment using a molding material.

FIG. 3B illustrates a configuration of another MEMS package formed by enclosing the MEMS device 100, which is made by the method of the first preferred embodiment, using a plastic molding material 72 through post-molded packaging techniques.

Figure 4A:
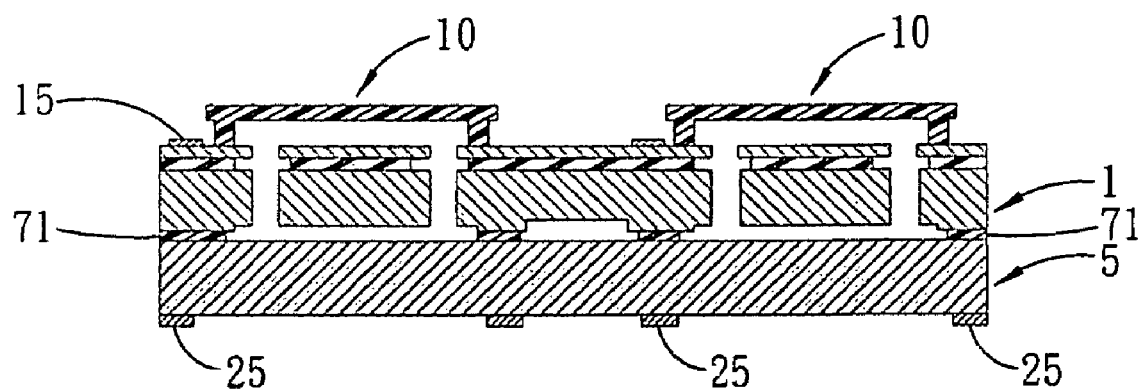
FIGS. 4A and 4B are schematic sectional views to illustrate two consecutive steps of the second preferred embodiment of the method according to this invention.
Figure 4B:
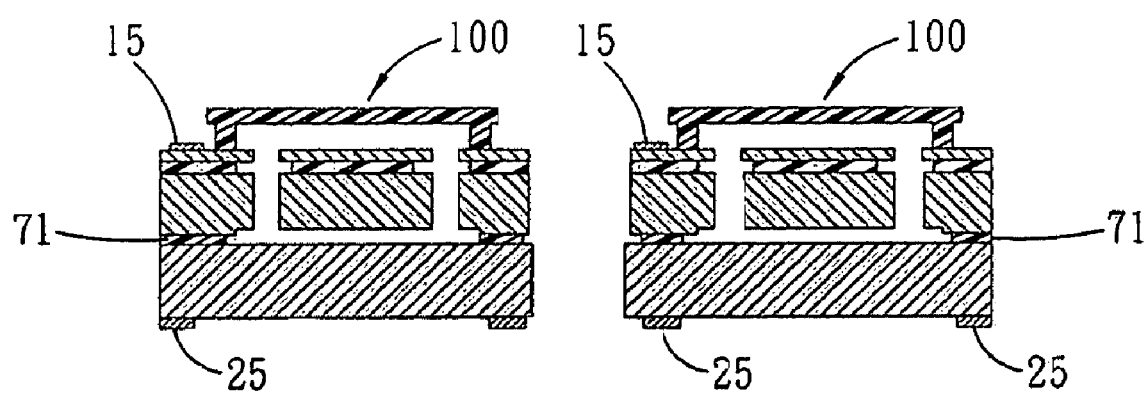

FIGS. 4A and 4B illustrate two consecutive steps of the second preferred embodiment of the method according to this invention. The second preferred embodiment differs from the previous embodiment in that the conductive pads 25 and the adhesive pads 71 are respectively disposed at opposite sides of the die of the circuit wafer 5. As such, the MEMS device 100 thus formed is a flip-chip-type device. FIG. 4A illustrates the step of bonding the circuit wafer 5 to the device wafer 1 through the adhesive pads 71. FIG. 4B illustrates the step of cutting simultaneously the device wafer 1 and the circuit wafer 5 of the assembly of the device wafer 1, the circuit wafer 5 and the cover caps 18 so as to form the individual MEMS devices 100.

Figure 5A:
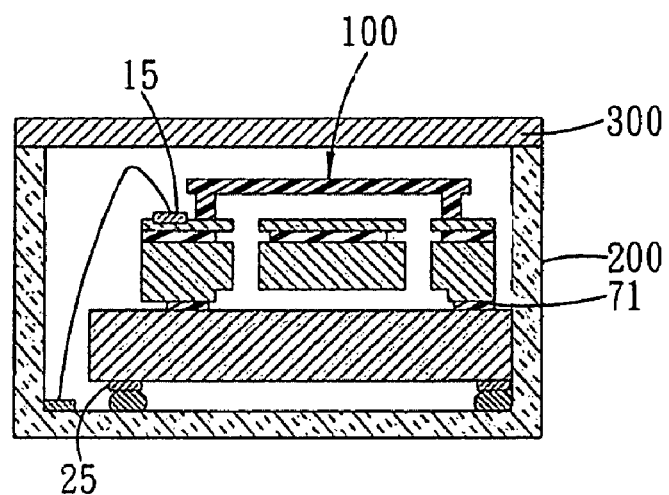
FIG. 5A is a schematic sectional view to illustrate a configuration of a MEMS package formed by ceramic packaging a MEMS device made by the method of the second preferred embodiment using a container and a cover plate.

FIG. 5A illustrates a configuration of a MEMS package formed by encapsulating the MEMS device 100, which is made by the method of the second preferred embodiment, using a ceramic container 200 and a cover plate 300 through ceramic packaging techniques.

Figure 5B:
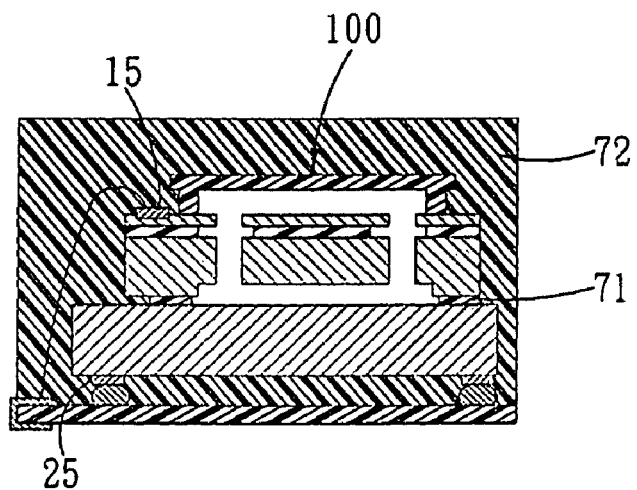
FIG. 5B is a schematic sectional view to illustrate a configuration of a MEMS package formed by post-molded packaging a MEMS device made by the method of the second preferred embodiment using a molding material.
Figure 6A:
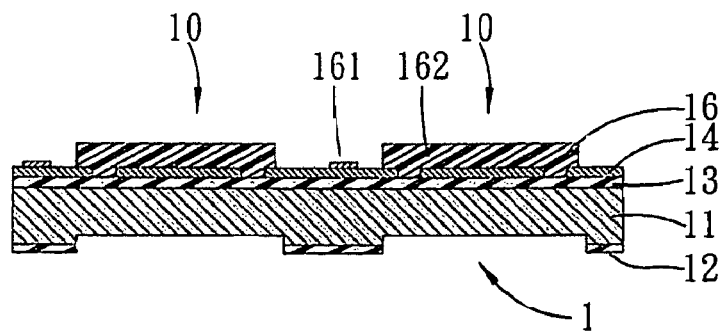
FIGS. 6A to 6F are schematic sectional views to illustrate consecutive steps of the third preferred embodiment of the method according to this invention.
Figure 6B:
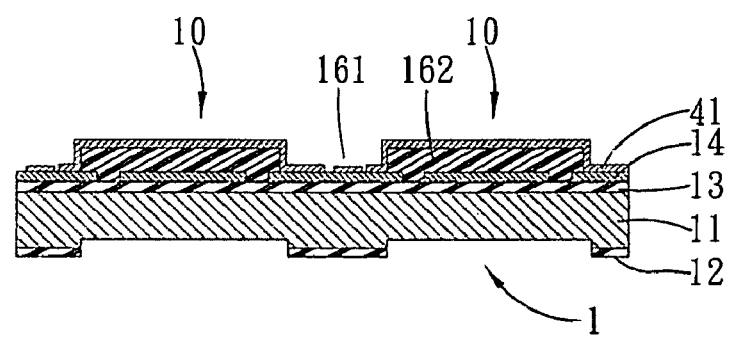
Figure 6C:
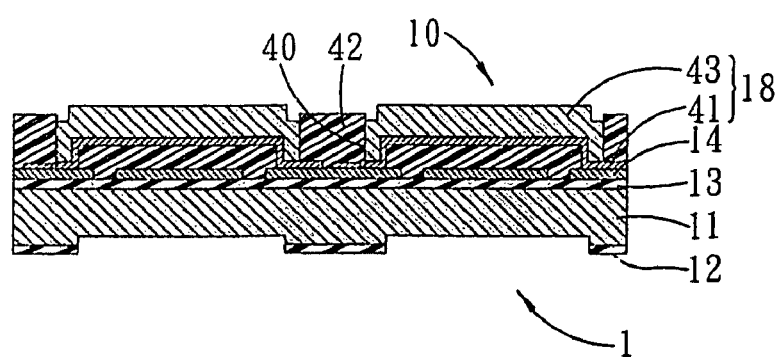
Figure 6D:
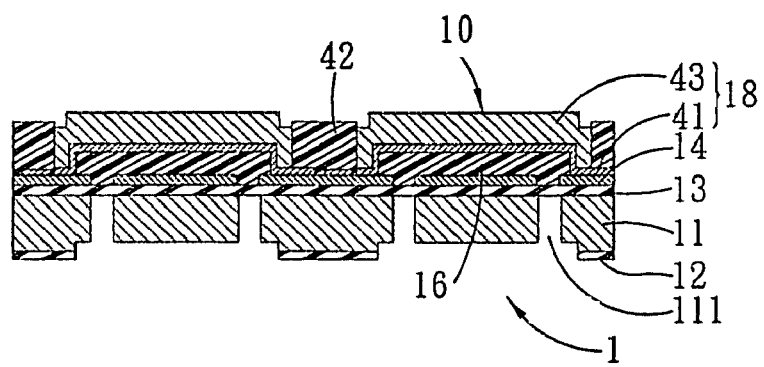
Figure 6E:
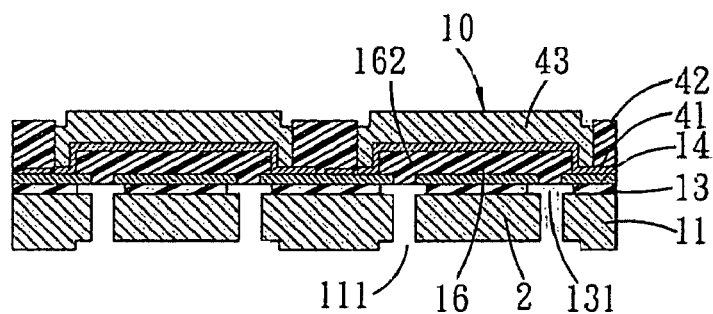
Figure 6F:
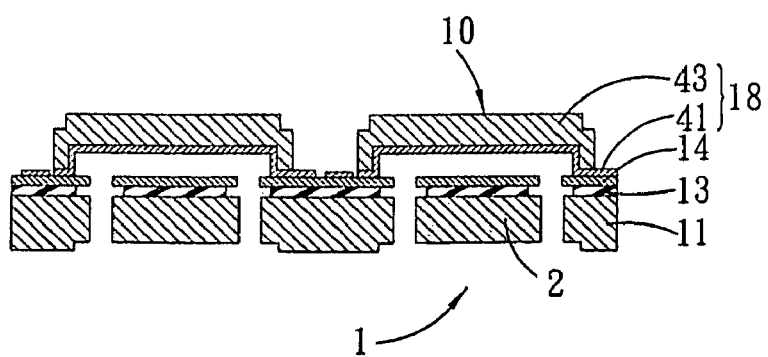

FIG. 5B illustrates a configuration of another MEMS package formed by enclosing the MEMS device 100, which is made by the method of the second preferred embodiment, using a plastic molding material 72 through post-molded packaging techniques.

FIGS. 6A to 6F illustrate consecutive steps of the third preferred embodiment of the method according to this invention. The third preferred embodiment differs from the previous embodiments in that each of the cover caps 18 is formed by forming a seed layer 41 of a first metal on the patterned sacrificial layer 16 (see FIGS. 6A and 6B) and a plating layer 43 of a second metal on the seed layer 41 (see FIG. 6C). The seed layer 41 is formed in a manner such that the seed layer 41 cooperates with the device wafer 1 to enclose a respective one of the enclosed portions 162 of the sacrificial layer 16 and extends into a respective one of the loop-shaped through-holes 161 in the sacrificial layer 16.

The method of the third preferred embodiment further includes the step of forming a plurality of cap-defining walls 42 on the front side of the device wafer 1 after formation of the seed layer 41 and prior to formation of the plating layer 43 (see FIG. 6C) such that each of the cap-defining walls 42 cooperates with the respective seed layer 41 to define a loop-shaped gap 40 therebetween. The plating layer 43 of each of the cover caps 18 is formed in a manner such that the plating layer 43 extends into the loop-shaped gap 40 between a respective one of the cap-defining walls 42 and the seed layer 41 of the respective one of the cover caps 18. The first hole 111 in the active layer 11 (see FIG. 6D) and the second hole 131 in the insulator layer 13 (see FIG. 6E) are subsequently formed after formation of the cover caps 18 so as to expose the sacrificial layer 16 from the back side of the device wafer 1. The cap-defining walls 42 are preferably made from a photoresist material, and are simultaneously removed during removal of the enclosed portions 162 of the sacrificial layer 16 in step (e) (see FIG. 6F).

Preferably, the first metal is selected from the group consisting of Ti, Cu, and Al, and the second metal is selected from the group consisting of Ni, Cu, and Ni—Fe.

In this embodiment, formation of the seed layer 41 is conducted through vapor deposition techniques, and formation of the plating layer 43 is conducted through plating techniques.

Each of the cover caps 18 thus formed has a high mechanical strength by virtue of the metal that forms the cover caps 18, and thereby preventing collapse of the cover caps 18 from occurring during dicing or packaging of the assembly of the device wafer 1, the circuit wafer 5 and the cover caps 18.

By forming the cover caps 18 prior to formation of the active parts 2 in the active units 10 of the device wafer 1 or prior to the release of the active parts 2 from the surrounding walls 3 of the device wafer 1, and by using metal to form the cover caps 18 in the method of this invention, the aforesaid drawbacks associated with the prior art can be eliminated.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A method for making micro-electromechanical system devices, comprising:

(a) forming a sacrificial layer on a front side of a device wafer which has a plurality of active units, the device wafer including an active layer, a suspender layer, and an insulator layer sandwiched between the active layer and the suspender layer, the suspender layer and the active layer defining the front and back sides of the device wafer, respectively, the sacrificial layer being formed on the suspender layer, and the suspender layer patterned to form a plurality of through-holes therein at each of the active units prior to the formation of the sacrificial layer thereon;

(b) forming a plurality of loop-shaped through-holes in the sacrificial layer so as to form the sacrificial layer into a plurality of enclosed portions, each of which is surrounded by a loop-shaped route of a respective one of the loop-shaped through-holes and each of which is aligned with a respective one of the active units of the device wafer, sacrificial layer extending into the through-holes in the suspender layer in step (a);

(c) forming a plurality of cover caps on the sacrificial layer such that each of the cover caps is aligned with a respective one of the active units of the device wafer and extends into a respective one of the loop-shaped through-holes in the sacrificial layer to contact the front side of the device wafer so as to cooperate with a respective one of the active units of the device wafer to enclose a respective one of the enclosed portions of the sacrificial layer, the cover caps formed on the sacrificial layer by forming a cap-forming layer on the sacrificial layer such that the cap-forming layer extends into the through-holes, followed by patterning the cap-forming layer through photolithographic techniques;

(d) forming a device through-hole in each of the active units of the device wafer so as to form an active part suspended in each of the active units of the device wafer and so as to expose a respective one of the enclosed portions of the sacrificial layer from a back side of the device wafer, the device through-hole in each of the active units (i) extending at least through the active layer and the insulator layer, and (ii) being in spatial communication with the through-holes in the suspender layer at the respective one of the active units, the device through-hole in each of the active units formed by forming a first hole in the active layer, followed by forming a second hole in the insulator layer that is in spatial communication with the first hole in the active layer and the through-holes in the suspender layer at the respective one of the active units; and (e) removing the enclosed portions of the sacrificial layer through the device through-holes in the active units of the device wafer.

2. The method of claim 1, wherein the active layer is made from silicon, the insulator layer is made from silicon dioxide, and the suspender layer is made from silicon.

3. The method of claim 1, wherein formation of the first hole in the active layer is conducted through inductively coupled plasma etching techniques.

4. The method of claim 1, wherein formation of the second hole in the insulator layer is conducted through wet etching techniques.

5. The method of claim 1, wherein the sacrificial layer is made from a photoresist material.

6. The method of claim 1, wherein the cap-forming layer is made from a photosensitive material.

7. The method of claim 1, wherein the cap-forming layer is made from bisbenzocyclobutene.

8. A method for making micro-electromechanical system devices, comprising:

(a) forming a sacrificial layer on a front side of a device wafer which has a plurality of active units, the device wafer including an active layer, a suspender layer, and an insulator layer sandwiched between the active layer and the suspender layer, the suspender layer and the active layer defining the front and back sides of the device wafer, respectively, the sacrificial layer being formed on the suspender layer, and the suspender layer patterned to form a plurality of through-holes therein at each of the active units prior to the formation of the sacrificial layer thereon;

(b) forming a plurality of loop-shaped through-holes in the sacrificial layer so as to form the sacrificial layer into a plurality of enclosed portions, each of which is surrounded by a loop-shaped route of a respective one of the loop-shaped through-holes and each of which is aligned with a respective one of the active units of the device wafer, sacrificial layer extending into the through-holes in the suspender layer in step (a);

(c) forming a plurality of cover caps on the sacrificial layer such that (1) each of the cover caps (i) is aligned with a respective one of the active units of the device wafer, and (ii) extends into a respective one of the loop-shaped through-holes in the sacrificial layer to contact the front side of the device wafer so as to cooperate with a respective one of the active units of the device wafer to enclose a respective one of the enclosed portions of the sacrificial layer, (2) extends into the through-holes, followed by patterning the cap-forming layer through photolithographic techniques, each of the cover caps including a seed layer of a first metal formed on the sacrificial layer by vapor deposition and extending into a respective one of the loop-shaped through-holes in the sacrificial layer, and a plating layer of a second metal formed on the seed layer by a plating technique, and (3) forming a plurality of cap-defining walls on the front side of the device wafer after formation of the seed layer and prior to formation of the plating layer such that (i) each of the cap-defining walls cooperates with the respective seed layer to define a loop-shaped gap therebetween, and (ii) the plating layer of each of the cover caps extends into the loop-shaped gap between a respective one of the cap-defining walls and the seed layer of the respective one of the cover caps;

(d) forming a device through-hole in each of the active units of the device wafer so as to form an active part suspended in each of the active units of the device wafer and so as to expose a respective one of the enclosed portions of the sacrificial layer from a back side of the device wafer, the device through-hole in each of the active units (i) extending at least through the active layer and the insulator layer, and (ii) being in spatial communication with the through-holes in the suspender layer at the respective one of the active units, the device through-hole in each of the active units formed by forming a first hole in the active layer, followed by forming a second hole in the insulator layer that is in spatial communication with the first hole in the active layer and the through-holes in the suspender layer at the respective one of the active units; and (e) removing the enclosed portions of the sacrificial layer through the device through-holes in the active units of the device wafer.

9. The method of claim 8, wherein the first metal is selected from the group consisting of Ti, Cu, and Al, and the second metal is selected from the group consisting of Ni, Cu, and Ni—Fe.

10. The method of claim 8, wherein the cap-defining walls are made from a photoresist material.

11. The method of claim 8, further comprising removing the cap-defining walls during removal of the enclosed portions of the sacrificial layer in step (e).

12. A method for making micro-electromechanical system devices, comprising:
   (a) forming a sacrificial layer on a front side of a device wafer which has a plurality of active units;
   (b) forming a plurality of loop-shaped through-holes in the sacrificial layer so as to form the sacrificial layer into a plurality of enclosed portions, each of which is surrounded by a loop-shaped route of a respective one of the loop-shaped through-holes and each of which is aligned with a respective one of the active units of the device wafer;
   (c) forming a plurality of cover caps on the sacrificial layer such that each of the cover caps is aligned with a respective one of the active units of the device wafer and extends into a respective one of the loop-shaped through-holes in the sacrificial layer to contact the front side of the device wafer so as to cooperate with a respective one of the active units of the device wafer to enclose a respective one of the enclosed portions of the sacrificial layer;
   (d) forming a device through-hole in each of the active units of the device wafer so as to form an active part suspended in each of the active units of the device wafer and so as to expose a respective one of the enclosed portions of the sacrificial layer from a back side of the device wafer;
   (e) removing the enclosed portions of the sacrificial layer through the device through-holes in the active units of the device wafer; and
   (f) attaching a circuit wafer to the back side of the device wafer after step (e) so as to cooperate with each of the cover caps and the device wafer to define an enclosed cavity thereamong for enclosing the active part of a respective one of the active units of the device wafer.

13. The method of claim 12, wherein the circuit wafer is adhesively bonded to the device wafer through a plurality of adhesive pads.

14. The method of claim 13, wherein the adhesive pads are made from bisbenzocyclobutene.

15. The method of claim 13, further comprising cutting the circuit wafer and the device wafer of the assembly of the circuit wafer, the device wafer and the cover caps so as to form a plurality of individual micro-electromechanical system devices.

16. The method of claim 15, further comprising coupling the device wafer to the circuit wafer through wire bonding techniques for each of the micro-electromechanical system devices, and packaging each of the micro-electromechanical system devices by disposing each of the micro-electromechanical system devices in a ceramic container, followed by sealing hermetically the ceramic container using a cover plate.

17. The method of claim 15, further comprising coupling the device wafer to the circuit wafer through wire bonding techniques for each of the micro-electromechanical system devices, and packaging each of the micro-electromechanical system devices by plastic molding techniques.

* * * * *